United States Patent
Xu et al.

(10) Patent No.: US 10,035,701 B2
(45) Date of Patent: Jul. 31, 2018

(54) COMPOSITE CAVITY AND FORMING METHOD THEREOF

(71) Applicant: ADVANCED SEMICONDUCTOR MANUFACTURING CO. LTD, Shanghai (CN)

(72) Inventors: Yuanjun Xu, Shanghai (CN); Yilin Yan, Shanghai (CN); Weijia Xue, Shanghai (CN)

(73) Assignee: Advanced Semiconductor Manufacturing Co. Ltd., Shanghai (CN)

( * ) Notice: Subject to any disclaimer, the term of this patent is extended or adjusted under 35 U.S.C. 154(b) by 0 days.

(21) Appl. No.: 15/305,799

(22) PCT Filed: Nov. 5, 2014

(86) PCT No.: PCT/CN2014/090326
§ 371 (c)(1),
(2) Date: Oct. 21, 2016

(87) PCT Pub. No.: WO2015/161641
PCT Pub. Date: Oct. 29, 2015

(65) Prior Publication Data
US 2017/0044006 A1 Feb. 16, 2017

(30) Foreign Application Priority Data

Apr. 25, 2014 (CN) .......................... 2014 1 0172235

(51) Int. Cl.
*B81B 7/02* (2006.01)
*B81C 1/00* (2006.01)

(52) U.S. Cl.
CPC ............ *B81B 7/02* (2013.01); *B81C 1/00158* (2013.01); *B81C 1/00396* (2013.01);
(Continued)

(58) Field of Classification Search
CPC .............. B81B 7/02; B81B 2201/0257; B81B 2201/0264; B81B 2203/01227; B81B 2203/0315; B81C 1/00158
See application file for complete search history.

(56) References Cited

U.S. PATENT DOCUMENTS

2008/0169522 A1* 7/2008 Arima ................. H01L 21/2007
257/415

FOREIGN PATENT DOCUMENTS

CN 101835079 A 9/2010
CN 102259828 A 11/2011
(Continued)

OTHER PUBLICATIONS

PCT International Search Report, PCT/CN2014/090326, dated Nov. 28, 2014.

*Primary Examiner* — Tucker J Wright
(74) *Attorney, Agent, or Firm* — Quarles & Brady LLP

(57) ABSTRACT

There is provided a method for forming a composite cavity and a composite cavity formed using the method. The method comprises the following steps: providing a silicon substrate (101); forming an oxide layer on the front side thereof; patterning the oxide layer to form one or more grooves (103), the position of the groove (103) corresponding to the position of small cavity (109) to be formed; providing a bonding wafer (104), which is bonded to the patterned oxide layer to form one or more closed microcavity structures (105) between the silicon substrate (101) and the bonding wafer (104); forming a protective film (106) over the bonding wafer (104) and forming a masking layer (107) on the back side of the silicon substrate (101); patterning the masking layer (107), the pattern of the masking layer (107) corresponding to the position of a large cavity (108) to be formed; using the masking layer (107) as a mask, etching the silicon substrate (101) from the back side until the oxide layer at the front side thereof to form the large cavity (108) in the silicon substrate (101); and using the masking layer (107) and the oxide layer as a mask, etching the bonding wafer (104) from the back side through the silicon substrate (101) until the protective film (106) thereover to form one or more small cavities (109) in the bonding (Continued)

wafer (104). The uniformity of thickness of the semiconductor medium layer where the small cavity (109) in the composite cavity is located is well controlled by the present invention.

5 Claims, 2 Drawing Sheets

(52) U.S. Cl.
CPC ............... *B81B 2201/0257* (2013.01); *B81B 2203/0127* (2013.01); *B81B 2203/0315* (2013.01); *B81C 2201/019* (2013.01); *B81C 2201/0132* (2013.01); *B81C 2201/0133* (2013.01); *B81C 2201/0198* (2013.01); *B81C 2201/053* (2013.01)

(56) References Cited

FOREIGN PATENT DOCUMENTS

| | | | |
|---|---|---|---|
| CN | 102259829 | A | 11/2011 |
| CN | 102259830 | A | 11/2011 |
| CN | 102320558 | A | 1/2012 |
| CN | 102328899 | A | 1/2012 |
| CN | 102328900 | A | 1/2012 |
| WO | 03090281 | A2 | 10/2003 |

\* cited by examiner

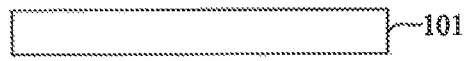
Fig. 1
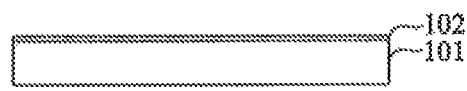
Fig. 2
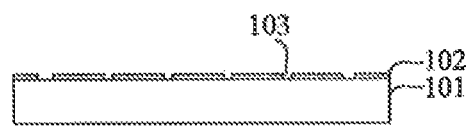
Fig. 3
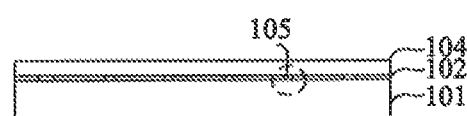
Fig. 4
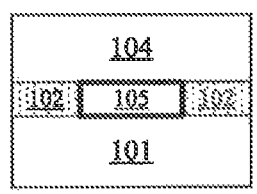
Fig. 4-A

COMPOSITE CAVITY AND FORMING METHOD THEREOF

CROSS-REFERENCE TO RELATED APPLICATIONS

This application represents the national stage entry of PCT International Application No, PCT/CN2014/090326 filed Nov. 5, 2014, which claims priority of Chinese Patent Application No. 2014101722359 filed Apr. 25, 20141, the disclosures of which are incorporated by reference here in their entirety for all purposes.

TECHNICAL FIELD

The present invention relates to the technical field of micro-electro mechanical systems (MEMS), in particular to a composite cavity and a forming method therefor.

BACKGROUND

At present, the MEMS microphone available on the market is usually a condenser microphone with a main structure consisting of a movable film and an almost immobile backplate (capacitor plate). Two capacitor plates (electrodes) forming a capacitor may be made of a materiel of monocrystalline silicon, polycrystalline silicon, a composite layer consisting of polycrystalline silicon and silicon nitride, a composite layer consisting of silicon nitride and metal, etc., among which the monocrystalline silicon and polycrystalline silicon are two main solutions. When a sound pressure is applied to a film, the film has different displacements depending on the intensity of the sound pressure, resulting in a change in capacitance and accordingly in the output voltage, so that the corresponding sound signal can be read by means of an amplifying circuit.

According to the current main solutions, i.e. monocrystalline silicon and polycrystalline silicon, for the capacitor plate of MEMS microphone, the methods for forming an acoustic cavity thereby are different.

1. For the solution using pure monocrystalline silicon, an approach consists in forming a cavity by etching in a lower capacitor plate of the MEMS microphone, pre-embedding an etching stop layer on the back side and forming a CSOI material and completing the front side process before opening the acoustic cavity by etching from the back side to the pre-embedded etching stop layer on the back side. This solution has the disadvantages of very high requirements on the machining precision of monocrystalline silicon at the top layer and the uniformity of thickness, high costs of the existing mechanical grinding or SIMBOND process, a very low yield, and inability of mass production. Moreover, since the thickness of the lower plate is controlled by stopping the back side etching at the pre-embedded oxide layer, the overall process has a great discreteness.

2. For the solution using pure polycrystalline silicon, the acoustic cavity is a single cavity formed by one-time etching at the back side, the two polycrystalline silicon layers at the front side of the wafer are upper and lower plates of capacitor. However, during the manufacture, the polycrystalline silicon is processed for different lengths of time in the two steps, the film stress is influenced interactively by polycrystalline growth conditions and high temperature conditions, such as annealing, resulting in a very high difficulty in control.

SUMMARY

The technical problem to be solved by the present invention is to provide a composite cavity and a forming method therefor, which can well control the uniformity of thickness of the semiconductor medium layer where the small cavity in the composite cavity is located.

To solve the above-mentioned technical problem, the present invention provides a method for forming a composite cavity, comprising the steps of:

A. providing a silicon substrate;

B. forming a silicon dioxide layer on the front side of said silicon substrate;

C. patterning said silicon dioxide layer to form one or more grooves, the position of said groove corresponding to the position of a small cavity to be formed in step H;

D. providing a bonding wafer, and bonding said bonding wafer with said patterned silicon dioxide layer to close said groove, so as to form one or more closed micro-cavity structures between said silicon substrate and said bonding wafer;

E, forming a protective film over said bonding wafer, and forming a masking layer on the hack side of said silicon substrate;

F. patterning said masking layer, the pattern of said masking layer corresponding to the position of a large cavity to be formed in step G;

G. using said masking layer as a mask, etching said silicon substrate from the back side until said silicon dioxide layer at the front side, and forming said large cavity in said silicon substrate;

H. using said masking layer and said silicon dioxide layer as a mask, etching said bonding wafer from the back side through said silicon substrate until said protective film thereover so as to form one or more said small cavities in said bonding wafer, said large cavity and said small cavity constituting said composite cavity.

Preferably, said silicon dioxide layer is formed by thermal oxidation or chemical vapour deposition.

Preferably, said silicon dioxide layer is patterned by dry etching or wet etching.

Preferably, the material of said bonding wafer is monocrystalline silicon, polycrystalline silicon or glass.

Preferably, the material of said masking layer is a photoresist or a semiconductor medium.

To solve the above-mentioned technical problem, the present invention further provides a composite cavity formed using the above-mentioned forming method, comprising a large cavity and a small cavity, both with a downward opening, wherein said large cavity passes through and is formed in the silicon substrate, a patterned silicon dioxide layer, as the bottom of said large cavity, is formed on the front side of said silicon substrate; the pattern of said silicon dioxide layer corresponds to the position of said small cavity; a bonding wafer is formed over said silicon dioxide layer; said small cavity passes through and is formed in said bonding wafer and is in communication with said large cavity; and a protective film, as the bottom of said small cavity, is formed over said bonding wafer.

Preferably, said silicon dioxide layer is formed by thermal oxidation or chemical vapour deposition.

Preferably, said silicon dioxide layer is patterned by dry etching or wet etching.

Preferably, the material of said bonding wafer is monocrystalline silicon, polycrystalline silicon or glass.

Compared with the prior art, the present invention has the following advantages:

The present invention combines the advantages of the pure monocrystalline solution and pure polycrystalline solution for MEMS microphones and provides a method for forming a composite cavity having its own lower capacitor plate (i.e., the semiconductor medium layer where the small cavity is located) on the basis of the two solutions. The present invention is suitable for production, has low costs, and only needs to control the stress of a single layer of lower capacitor plate in technical aspect.

The present invention can well control the uniformity of the monocrystalline silicon lower capacitor plate, which is proved to be achievable and an economic technical solution as compared with the high-cost substrate preparing method of the solution using pure monocrystalline silicon. Moreover, in the present invention, the complicated problem of stress interaction in thermal process of the double-layer polycrystal in the existing technology is simplified to the stress control of a single-layer polycrystal, and the stability from batch to batch is also well improved.

BRIEF DESCRIPTION OF THE DRAWINGS

The above-mentioned and other features, properties and advantages of the present invention will become more apparent from the following description of embodiments with reference to the accompany drawings, in which:

FIGS. 1-8 is a flow chart of a forming process for a composite cavity in one embodiment of the present invention; and FIG. 4-A is an enlarged schematic diagram of a micro-cavity structure as shown in FIG. 4.

DETAILED DESCRIPTION

Figure 5:
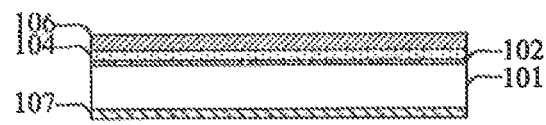

The present invention will be further described below in conjunction with particular embodiments and the accompanying drawings, and more details are explained in the following description, in order to fully understand the present invention; however, the present invention can obviously be implemented differently from what is described herein; a person skilled in the art can make similar extensions and deductions without departing from the connotation of the invention according to practical applications; and therefore the scope of protection of the present invention should not be limited to the contents of the particular embodiments herein.

An Embodiment of a Method for Forming a Composite Cavity

FIGS. 1-8 is a flow chart of a forming process for a composite cavity in one embodiment of the present invention. It should be noted that the drawings are merely used as examples, and are not necessarily drawn to scale, and should not be taken as a limitation to the actually claimed scope of protection of the present invention.

The process flow of the composite cavity mainly comprises the following steps.

The first step, as shown in FIG. 1, is to provide a silicon substrate 101, which silicon substrate 101 is a substrate of 6 inch, 8 inch, etc.

The second step, as shown in FIG. 2, is to form a silicon dioxide layer 102 on the front side of the silicon substrate 101, as an etching barrier layer in the subsequent process of forming a small cavity 109 by etching. Here, the silicon dioxide layer 102 may be formed by thermal oxidation or chemical vapour deposition.

The third step, as shown in FIG. 3, is to pattern the silicon dioxide layer 102 to form one or more grooves 103, the position of the groove 103 corresponding to the position of small cavity 109 to be formed in the eighth step. Here, the silicon dioxide layer 102 may be patterned by dry etching or wet etching.

The fourth step, as shown in FIG. 4, is to provide a bonding wafer 104, and bond the bonding wafer 104 with the patterned silicon dioxide layer 102 so as to close the grooves 103, thereby forming one or more closed micro-cavity structures 105 between the silicon substrate 101 and the bonding wafer 104. Here, the material of the bonding wafer 104 may be monocrystalline silicon, polycrystalline silicon or glass (a semiconductor medium).

FIG. 4-A is an enlarged schematic diagram of a micro-cavity structure as shown in FIG. 4. As shown in FIG. 4-A, which is an enlarged view of one micro-cavity structure 105 (shown by the dotted circle) formed in FIG. 4, which facilitates illustrating the construction of the micro-cavity structure 105 more clearly.

The fifth step, as shown in FIG. 5, is to form a protective film 106 over the bonding wafer 104, and form a masking layer 107 on the back side of the silicon substrate 101. Here, the material of the masking layer 107 may be a photoresist or a semiconductor medium.

Figure 6:
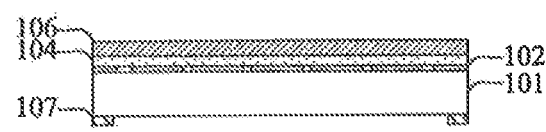

The sixth step, as shown in FIG. 6, is to pattern the masking layer 107, the pattern of the masking layer 107 corresponding to the position of a large cavity 108 to be formed in the seventh step.

Figure 7:
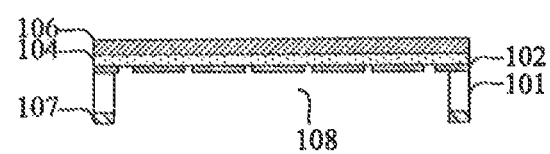

The seventh step, as shown in FIG. 7, is to etch the silicon substrate 101 from the back side until the silicon dioxide layer 102 (etching barrier layer) at the front side, using the patterned masking layer 107 as a mask, so as to form the large cavity 108 in the silicon substrate 101. Then, the one or more micro-cavity structures 105 which are previously closed are opened from below.

Figure 8:
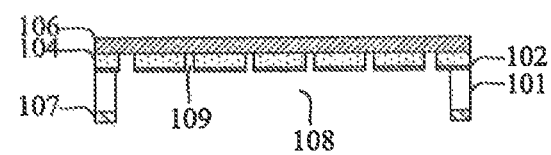

The eighth step, as shown in FIG. 8, is to etch the bonding wafer 104 from the back side through the silicon substrate 101 until the protective film 106 thereover, using the masking layer 107 and the patterned silicon dioxide layer 102 as a mask, so as to form one or more small cavities 109 in the bonding wafer 104, the large cavity 108 and the small cavities 109 constituting the composite cavity.

The Embodiment of Composite Cavity

This embodiment can be formed using the above-mentioned method embodiment and uses the reference numbers of elements and part of contents of the preceding embodiment, wherein the same reference numbers are used to denote the same or similar elements, and the description of the same technical content is selectively omitted.

See FIG. 8, the composite cavity may comprise a large cavity 108 and one or more small cavities 109, both with a downward opening. The large cavity 108 passes through and is formed in the silicon substrate 101, and a patterned silicon dioxide layer 102 (as an etching barrier layer when etching to form the large cavity 108) as the bottom of large cavity 108 is formed on the front side of the silicon substrate 101. The pattern of the silicon dioxide layer 102 corresponds to the positions of the small cavities 109. A bonding wafer 104 is formed over the silicon dioxide layer 102, and the material of the bonding wafer 104 may be monocrystalline silicon, polycrystalline silicon or glass (a semiconductor medium); and one or more small cavities 109 pass through and are formed in the bonding wafer 104 and are in communication with the large cavity 108. A protective film 106, as the bottom of the small cavities 109, is formed above the bonding wafer 104.

In this embodiment, the silicon dioxide layer 102 may be formed by oxidation or chemical vapour deposition; and the silicon dioxide layer 102 may be patterned by dry etching or wet etching.

The present invention combines the advantages of the pure monocrystalline solution and pure polycrystalline solution for MEMS microphones and provides a method for forming a composite cavity having its own lower capacitor plate (i.e., the semiconductor medium layer where the small cavity is located) on the basis of the two solutions. The present invention is suitable for production, has low costs, and only needs to control the stress of a single layer of lower capacitor plate in technical aspect.

The present invention can well control the uniformity of the monocrystalline silicon lower capacitor plate, which is proved to be achievable and an economic technical solution as compared with the high-cost substrate preparing method of the solution using pure monocrystalline silicon. Moreover, in the present invention, the complicated problem of stress interaction in thermal process of the double-layer polycrystal in the existing technology is simplified to the stress control of a single-layer polycrystal, and the stability from batch to batch is also well improved.

The present invention has been disclosed above in terms of the preferred embodiments which are not intended to limit the present invention, and any person skilled in the art could make possible changes and alterations without departing from the spirit and scope of the present invention. Hence, any alteration, equivalent change and modification which are made to the above-mentioned embodiments in accordance with the technical substance of the present invention and without departing from the contents of the present invention, will fall within the scope of protection defined by the claims of the present invention.

What is claimed is:

1. A method for forming a composite cavity, comprising:
   A. providing a silicon substrate;
   B. forming a silicon dioxide layer on a front side of said silicon substrate;
   C. patterning said silicon dioxide layer to form one or more grooves, the position of said groove corresponding to the position of a small cavity to be formed in step H;
   D. providing a bonding wafer, and bonding said bonding wafer with said patterned silicon dioxide layer to close said groove, so as to form one or more closed microcavity structures between said silicon substrate and said bonding wafer;
   E. forming a protective film over said bonding wafer, and forming a masking layer on a back side of said silicon substrate;
   F. patterning said masking layer, the pattern of said masking layer corresponding to the position of a large cavity to be formed in step G;
   G. using said masking layer as a mask, etching said silicon substrate from the back side until said silicon dioxide layer at the front side, and forming said large cavity in said silicon substrate;
   H. using said masking layer and said silicon dioxide layer as a mask, etching said bonding wafer from the back side through said silicon substrate until said protective film thereover so as to form one or more said small cavities in said bonding wafer, said large cavity and said small cavity constituting said composite cavity.

2. The method for forming a composite cavity according to claim 1, wherein said silicon dioxide layer is formed by thermal oxidation or chemical vapor deposition.

3. The method for forming a composite cavity according to claim 2, wherein said silicon dioxide layer is patterned by dry etching or wet etching.

4. The method for forming a composite cavity according to claim 3, wherein the material of said bonding wafer is monocrystalline silicon, polycrystalline silicon or glass.

5. The method for forming a composite cavity according to claim 4, wherein the material of said masking layer is a photoresist or a semiconductor medium.

* * * * *

UNITED STATES PATENT AND TRADEMARK OFFICE
CERTIFICATE OF CORRECTION

PATENT NO.       : 10,035,701 B2
APPLICATION NO.  : 15/305799
DATED            : July 31, 2018
INVENTOR(S)      : Yuanjun Xu et al.

It is certified that error appears in the above-identified patent and that said Letters Patent is hereby corrected as shown below:

In the Specification

Column 2, Line 19, "the hack side" should be --the back side--.

Signed and Sealed this
Ninth Day of October, 2018

Andrei Iancu
*Director of the United States Patent and Trademark Office*